ative, conducting contact layer on the exposed surface of a gallium arsenide photovoltaic cell. Increased conductivity for the high current generated when concentrated solar radiation strikes the cell, is provided by doping the AlGaAs layer with magnesium. During the formation of the layer, Mg diffuses into the gallium arsenide to form a p-type layer and a p-n junction.

United States Patent [19]
Moon

[11] 4,126,930
[45] Nov. 28, 1978

[54] MAGNESIUM DOPING OF ALGAAS
[75] Inventor: Ronald L. Moon, Menlo Park, Calif.
[73] Assignee: Varian Associates, Inc., Palo Alto, Calif.
[21] Appl. No.: 849,136
[22] Filed: Nov. 7, 1977

Related U.S. Application Data
[62] Division of Ser. No. 588,266, Jun. 19, 1975, abandoned.
[51] Int. Cl.² .......................................... H01L 21/208
[52] U.S. Cl. ................. 29/572; 136/89 SG; 148/171; 148/172
[58] Field of Search .................. 136/89 SG; 148/171, 148/172, 175; 29/572; 357/16

[56] References Cited
U.S. PATENT DOCUMENTS

| | | | |
|---|---|---|---|
| 3,615,931 | 10/1971 | Arthur | 148/175 |
| 3,675,026 | 7/1972 | Woodall | 148/171 X |
| 3,751,310 | 8/1973 | Cho | 148/175 |
| 3,839,084 | 10/1974 | Cho et al. | 148/175 X |

OTHER PUBLICATIONS

Hovel et al., *IBM Technical Disclosure Bulletin*, vol. 15, No. 12, May 1973, p. 3741.
Hovel et al., *IBM Technical Disclosure Bulletin*, vol. 16, No. 7, Dec. 1973, pp. 2079 and 2080.

*Primary Examiner*—G. Ozaki
*Attorney, Agent, or Firm*—Stanley Z. Cole; Gerald M. Fisher

[57] ABSTRACT

Aluminum gallium arsenide is used as a transparent, conducting contact layer on the exposed surface of a gallium arsenide photovoltaic cell. Increased conductivity for the high current generated when concentrated solar radiation strikes the cell, is provided by doping the AlGaAs layer with magnesium. During the formation of the layer, Mg diffuses into the gallium arsenide to form a p-type layer and a p-n junction.

6 Claims, 3 Drawing Figures

MAGNESIUM DOPING OF ALGAAS

This is a division of application Ser. No. 588,266, filed June 19, 1975, now abandoned.

FIELD OF THE INVENTION

The invention relates to semiconductive materials useful in devices such as solar photovoltaic cells. Near the surface exposed to the radiation in such cells, a p-n junction is formed across which the voltage is generated. An optically transparent contact layer is applied to the exposed surface to carry off the generated current. The inventive material provides unusually good properties as a contact layer.

PRIOR ART

III-V compounds, particuarly gallium arsenide, have been a common material for photovoltaic cells. The bandgap in these materials can be matched to the photon energy to provide efficient conversion.

Hovel and Woodall, Journal of the Electrochemical Society, 1973, p. 1246, described forming a cell by depositing a layer of zinc-doped aluminum gallium arsenide on an n-type gallium arsenide crystal. Zinc was diffused into the gallium arsenide to form a p-type layer and p-n junction. The AlGaAs layer formed the surface contact. Much difficulty was expereienced in controlling the p-type doping, and the resistance of the contact layer was too high.

Magnesium is known as a p-type dopant in certain III-V semiconductors. Hunsperger et al. Journal of Applied Physics 1972, P. 1318 described Mg in GaAs. Inada and Ohnuki, Applied Physics Letters, 1974, p. 228 describe Mg in GaP. These prior art references establish that Mg is a P-type dopant with lower diffusion rate than the conventional zinc, but do not hint or suggest the unexpectedly superior conductivity that Mg imparts to AlGaAs or the superior control it permits in forming a p-n junction in adjacent GaAs.

SUMMARY OF THE INVENTION

An objective of the invention is to provide a semiconductive material of improved p-type conductivity. A further objective is to provide an improved material for a conductive contact on the surface of a gallium arsenide semiconductive device. Another objective is to provide an improved p-type layer and p-n junction in a gallium arsenide device. A further objective is to provide an improved photo voltaic cell suitable for operation in concentrated sunlight.

These objectives are achieved by doping aluminum gallium arsenide with magnesium. It was unexpectedly discovered that magnesium dopant can produce higher conductivities than previously used zinc dopant, and over a wide range of aluminum-to-gallium ratios. The resultant transparent material forms a superior contact layer on the surface of a gallium arsenide photovoltaic cell. The cell may be used to convert concentrated sunlight to electricity because the resistance of the contact layer is low enough to carry the high current density generated without excessive power loss.

A further advantage of the magnesium dopant is that, when the AlGaAs layer is being grown on the surface of n-type GaAs, Mg diffuses into the GaAs to form a p-type layer and a p-n junction. It was found that the high concentration of Mg possible in the AlGaAs layer, in combination with diffusion rates considerably slower than prior-art dopants in AlGaAs such as Zn, made possible superior control of the composition and thickness of the p-type layer and of the properties of the p-n junction. The term "aluminum gallium arsenide" (AlGaAs) is used to mean a compound of 50% atomic fraction arsenic, less than 50% aluminum and the remainder gallium ($Al_xGa_{(1-x)}As$, where $x$ is intermediate 0 and 1.0). In addition to this formula, small amounts of dopants are understood to be included.

DETAILED DESCRIPTION OF THE PREFERRED EMBODIMENTS

Figure 1:
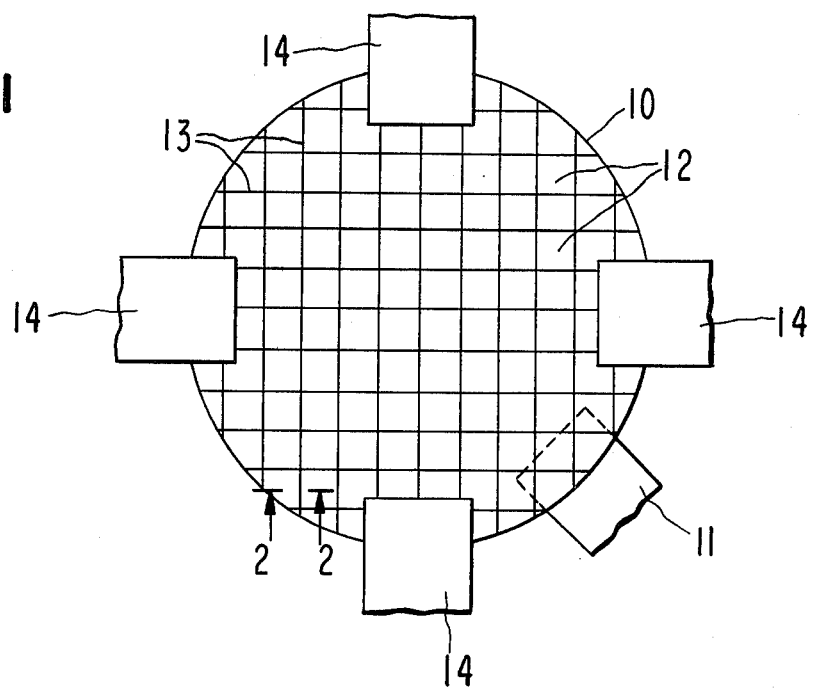
FIG. 1 is a top view of a solar photovoltaic cell utilizing the invention.

FIG. 1 shows a solar cell as seen from the direction of incident light. The circular cell is formed on a single-crystal substrate disc 10 of gallium arsenide, such as 3 cm in diameter by 1 mm thick. The bottom side of disc 10 is covered with a metallic ohmic contact 20 (FIG. 2) connected to a negative current lead 11. On the top, light receiving side of disc 10 the photovoltaic junction is formed, exposed through an array of apertures 12 in an overlying metallic mesh electrode 13 which collects the current from the apertures 12 and delivers it to surrounding positive current leads 14.

Figure 2:
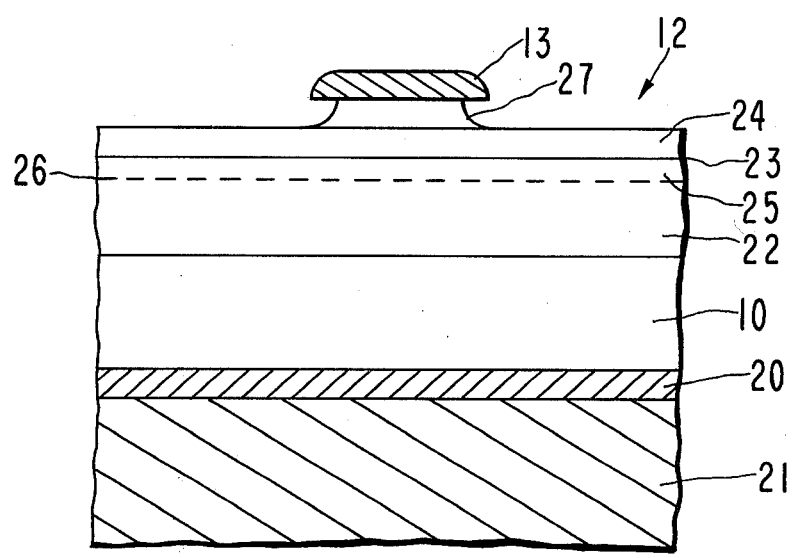
FIG. 2 is a schematic section of a portion of the cell of FIG. 1 taken in the direction of the arrows 2—2.

FIG. 2 shows the detailed structure of a portion of the cell of FIG. 1. The dimensions are not to scale in order that very thin but important layer structure may be explained. Gallium arsenide substrate 10 is doped for n-type conductivity with, for example, $10^{18}$ atoms per cubic centimeter of tin. Substrate 10 is coated on its bottom with an ohmic contact layer 20, as of gold and tin. Contact 20 is bonded as by tin solder to a heat sink 21, of thermally conductive material such as molybdenum. On top of substrate 10 is grown an epitaxial layer 22 of n-type gallium arsenide, 20 microns thick, to provide a surface 23 of reduced crystalline defects. On surface 23 is grown an epitaxial contact layer 24, 2 microns thick, of the novel material, alumimum gallium arsenide doped with magnesium. Layer 24 is transparent to solar radiation. The atomic composition of contact layer 24 may be, for example, 40 parts Al, 10 parts Ga, 50 parts As and $2.2 \times 10^{-5}$ parts Mg. This material in one example had a p-type carrier concentration of $1.7 \times 10^{18}$ per cc and a resistivity of 0.026 ohm-cm. Compared with known n-type AlGaAs doped with Sn, the above values are significantly better than those achieved in the prior art, where in one reported experiment (Panish, Journal of Applied Physics 1973 p. 261) only $3 \times 10^{17}$ electrons per cc were obtained in a crystal with only 15% Al.

The high conductivity and high transparency of the Mg doped 40% Al contact layer allow a thickness to be grown adequate to carry the high current density such as 1 to 10 amperes per square cm produced in a cell irradiated with solar light concentrated by an area ratio of several hundred, as by a collecting lens or mirror. The use of concentrators allows great reduction in the cost of solar energy conversion because the area of expensive photovoltaic cells is reduced by the concentration ratio.

During the epitaxial growth of the AlGaAs layer 24, magnesium atoms diffuse from it into the underlying GaAs layer 22 producing a thin layer 25 of Mg-doped p-type GaAs and a p-n junction 26 with the underlying n-type GaAs. The cell voltage is generated across junction 26. The diffusion rate in GaAs is much lower for Mg than for prior art Zn so that the depth and doping concentration of the p-type layer and the properties of the p-n junction are much easier to control. The thickness of the p layer is especially critical because the incident radiation must penetrate through it to the n-type layer.

Current from junction 26 flows through the transparent contact layer 24 and is collected at the edges of receiving apertures 12 by the metal grid mesh conductors 13. Mesh 13, 4 microns thick, is deposited on the top surface of contact layer 24 by conventional photoetching techniques well known to those skilled in the art. For improved contact a 3 micron layer 27 of p+ type GaAs is first deposited on contact layer 25 underlying the conductors 13.

Figure 3:
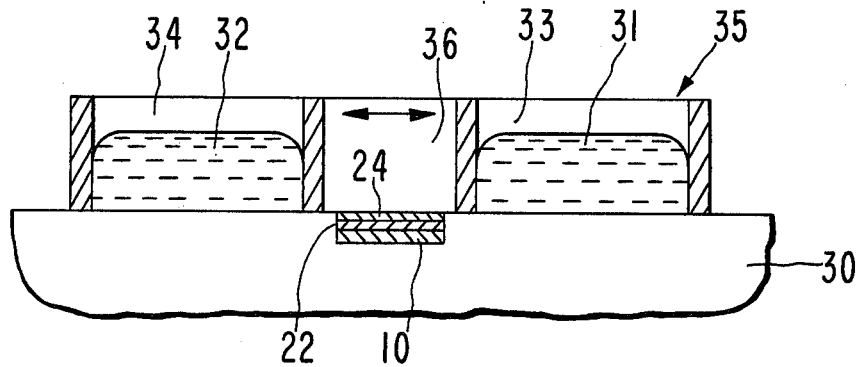
FIG. 3 is a schematic view illustrating a process step in forming the cell of FIG. 1.

FIG. 3 illustrates a well known method of forming epitaxial layers 22 and 24. Substrate chip 10 is held in a recess in an inert base 30. The materials 31 and 32 from which the epitaxial layers are to be grown are contained in open-bottomed bins 33, 34 in an inert holder 35 resting on base 30. Substrate 10 is positioned in an empty bin 36 until growth is to begin. The apparatus is heated in an inert atmosphere in a surrounding furnace (not shown) to melt the material 31. Then bin 33 is slid over the substrate 10 and the temperature lowered to grow liquid epitaxy layer 22.

When the desired thickness has been grown the bin 33 and excess liquid 31 is slid away. The second epitaxy layer 24 is then grown by repeating the process with material 32 to bin 34.

The above embodiments of the invention are exemplary and not intended to be limiting. Many other embodiments and uses of the inventive material will become obvious to those skilled in the art. The invention is intended to be limited only by the following claims and their legal extensions.

What is claimed is:

1. A process for making a photovoltaic cell comprising the steps of:

epitaxially growing on an n-type semiconductive body a contact layer of aluminum gallium arsenide doped with magnesium, heating said layer and said semiconductor to diffuse magnesium dopant into said semiconductor to form a p-type layer adjacent said contact layer, and attaching a first electrode to said contact layer and a second electrode to said semiconductor.

2. The process of claim 1 further including the step of epitaxially growing said semiconductive body on a semiconductive substrate.

3. The process of claim 2 wherein said electrodes are attached to the surfaces of said contact layer and said substrate respectively on sides opposite said semiconductive body.

4. The process of claim 1 wherein said semiconductive body is a compound of one or more elements of column III of the Periodic Table with one or more elements of column V.

5. The process of claim 4 wherein said semiconductive body is gallium arsenide.

6. The process of claim 1 wherein said epitaxial growth and said diffusion occur simultaneously.

* * * * *